US012622073B2

(12) United States Patent
Ye et al.

(10) Patent No.: US 12,622,073 B2
(45) Date of Patent: May 5, 2026

(54) HYBRID IMAGE SENSOR HAVING DIES BONDED TO PIXEL SUBSTRATE

(71) Applicant: WUHAN XINXIN SEMICONDUCTOR MANUFACTURING CO., LTD., Hubei (CN)

(72) Inventors: Guoliang Ye, Hubei (CN); Shengjin Song, Hubei (CN); Sheng Hu, Hubei (CN); Ying Wang, Hubei (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 593 days.

(21) Appl. No.: 18/087,924

(22) Filed: Dec. 23, 2022

(65) Prior Publication Data

US 2024/0136387 A1 Apr. 25, 2024
US 2024/0234476 A9 Jul. 11, 2024

(30) Foreign Application Priority Data

Oct. 25, 2022 (CN) .......................... 202211313535.5

(51) Int. Cl.
*H10F 39/00* (2025.01)
*H10F 39/12* (2025.01)

(52) U.S. Cl.
CPC ......... *H10F 39/018* (2025.01); *H10F 39/199* (2025.01); *H10F 39/804* (2025.01); *H10F 39/809* (2025.01); *H10F 39/811* (2025.01)

(58) Field of Classification Search
CPC ..... H10F 39/018; H10F 39/809; H10F 39/811
See application file for complete search history.

(56) References Cited

U.S. PATENT DOCUMENTS

2018/0227549 A1* 8/2018 Cai ........................ H10F 39/809
2021/0273013 A1* 9/2021 Chiou ................... H10F 39/811
(Continued)

FOREIGN PATENT DOCUMENTS

CN 107240593 A 10/2017
CN 111627941 A 9/2020
(Continued)

*Primary Examiner* — Kevin Parendo
(74) *Attorney, Agent, or Firm* — MUNCY, GEISSLER, OLDS & LOWE, P.C.

(57) ABSTRACT

An image sensor structure and a method of fabricating the structure are disclosed, in image sensor structure, at least one die is bonded to pixel substrate by bonding first bonding layer to second bonding layer, and the die includes signal processing circuit and/or storage device for photosensitive elements in pixel substrate. The die is bonded to the pixel substrate so that the signal processing circuit and/or storage device is/are coupled to photosensitive elements in pixel substrate. In this way, signal processing and/or storage functions of the image sensor can be provided without additional occupation of the area of the pixel substrate, allowing for more photosensitive elements to be arranged on the pixel substrate with the same area and thus resulting in a larger photosensitive area. Moreover, less wiring is needed on the 2D plane of the pixel substrate, helping in reducing interference with signals and delays and improving imaging quality.

7 Claims, 3 Drawing Sheets

(56) References Cited

U.S. PATENT DOCUMENTS

| 2021/0313290 A1* | 10/2021 | Kyung | .................... H01L 24/32 |
| 2022/0102397 A1* | 3/2022 | Wu | ....................... H10F 39/014 |
| 2022/0123035 A1* | 4/2022 | Seo | ....................... H10F 39/809 |
| 2022/0199670 A1* | 6/2022 | Jang | .................... H10F 39/8057 |

FOREIGN PATENT DOCUMENTS

| CN | 115117101 A | 9/2022 |
| JP | 2013175626 A | 9/2013 |

* cited by examiner

| | |
|---|---|
| Provide a pixel substrate having opposing first and second surfaces and a plurality of photosensitive elements between the first and second surfaces and successively forming, on the first surface, a first interconnect structure and a first bonding layer connected to the first interconnect structure, the first bonding layer including first metal bond pads | S1 |
| Form at least one die including a signal processing circuit and/or a storage device for the photosensitive elements, a second interconnect structure and a second bonding layer connected to the second interconnect structure, the second bonding layer including second metal bond pads | S2 |
| Bond at least one die to the pixel substrate by bonding the first bonding layer to the second bonding layer, wherein the first metal bond pads are electrically connected to the second metal bond pads | S3 |
| Form metal grid on the second surface | S4 |

Fig. 1

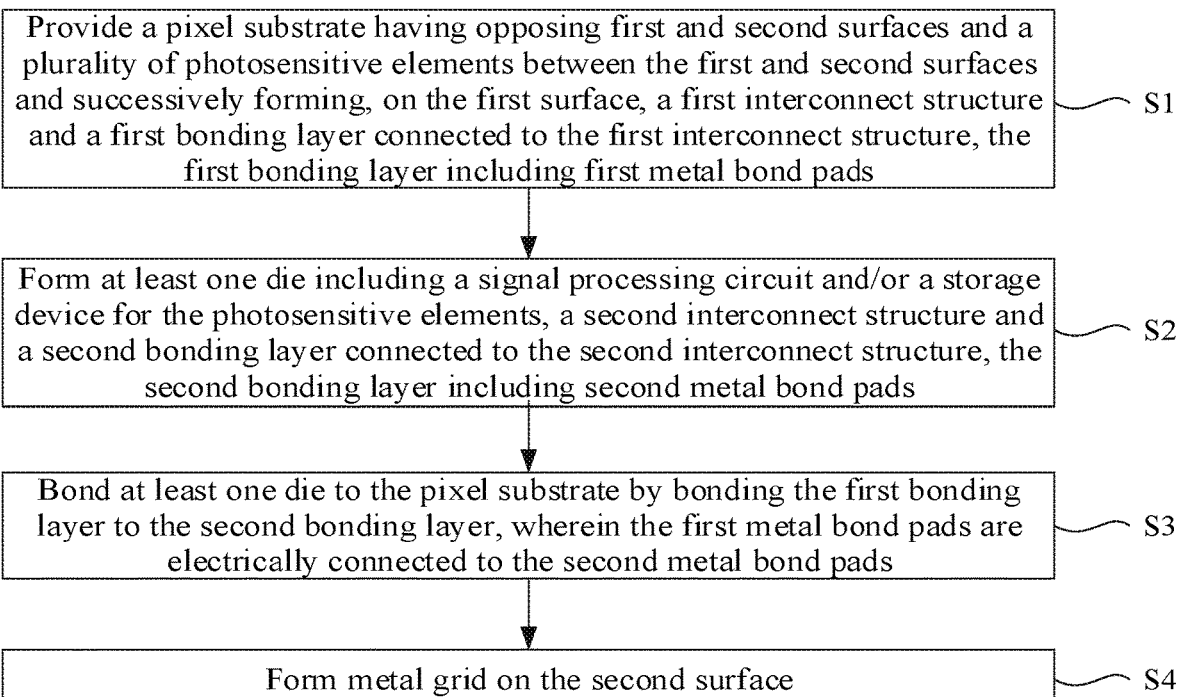

Fig. 2

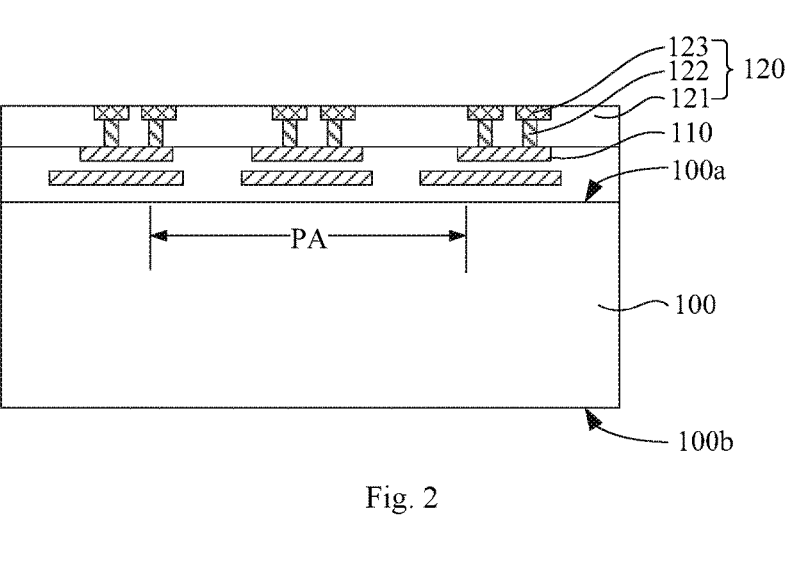

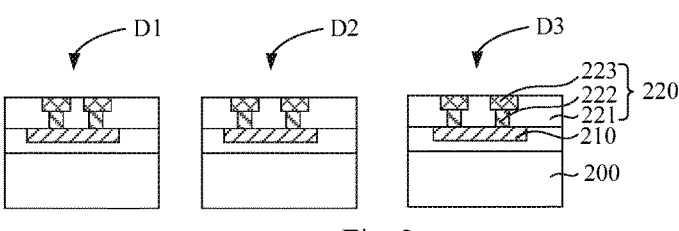

Fig. 3

HYBRID IMAGE SENSOR HAVING DIES BONDED TO PIXEL SUBSTRATE

CROSS-REFERENCES TO RELATED APPLICATION

This application claims the priority of Chinese patent application number 202211313535.5, filed on Oct. 25, 2022, the entire contents of which are incorporated herein by reference.

TECHNICAL FIELD

The present invention relates to the field of semiconductor technology and, in particular, to an image sensor structure and method of fabricating the structure.

BACKGROUND

Image sensors are core components of imaging devices, which take images by converting optical signals into electronic signals. For example, CMOS image sensors (CIS) had been widely used in various fields thanks to their advantages of low power consumption and high signal-to-noise ratio.

Traditional image sensors adopt two-dimensional (2D) architectures in which a photosensitive area and a logic circuit area are arranged in the 2D plane, making a rather large fraction of the chip area non-photosensitive. Since only a limited number of pixels can be arranged in the photosensitive area, imaging quality is suboptimal. Moreover, since the pixels in the photosensitive area and processing circuits in the logic circuit area are interconnected by traces in the 2D plane, interference with signals and delays tend to occur due to, among others, a complex wiring design, an excessively long wiring length and wiring layout limitations.

SUMMARY OF THE INVENTION

In order to overcome the above-described shortcomings of image sensors that employ 2D architectures, the present invention provides an image sensor structure and a method of fabricating the structure.

In one aspect, the present invention provides a method of fabricating an image sensor structure, including:

providing a pixel substrate having opposing first and second surfaces and a plurality of photosensitive elements between the first and second surfaces and successively forming, on the first surface, a first interconnect structure and a first bonding layer connected to the first interconnect structure, the first bonding layer including first metal bond pads;

forming at least one die including a signal processing circuit and/or a storage device for the photosensitive elements, a second interconnect structure and a second bonding layer connected to the second interconnect structure, the second bonding layer including second metal bond pads;

bonding the at least one die to the pixel substrate by bonding the first bonding layer to the second bonding layer, wherein the first metal bond pads are electrically connected to the second metal bond pads; and forming a metal grid on the second surface.

Optionally, after the at least one die is bonded to the pixel substrate, metal pads connected to the first interconnect structure may be formed on the second surface of the pixel substrate.

Optionally, before the metal grid is formed, the pixel substrate may be thinned from the second surface, wherein before the pixel substrate is thinned, a filling layer is formed on a region of the first bonding layer not covered by the die, and a carrier substrate is bonded to the die and the filling layer.

Optionally, the formation of the filling layer may include:

depositing a dielectric material over the pixel substrate on the region of the first bonding layer not covered by the die so that a top surface of the dielectric material is higher than a top surface of the die; and performing a planarization process on the top surface of the dielectric material so that the top surface of the die is exposed.

Optionally, the die may include a semiconductor substrate that has undergone a dicing process, wherein before the semiconductor substrate is subjected to the dicing process, it is thinned from the side away from the second bonding layer.

Optionally, the at least one die may be bonded to the pixel substrate so that orthographic projections of at least some of the at least one die on the first surface at least partially overlap an orthographic projection of a photosensitive area on the first surface, wherein the photosensitive area is adapted for arrangement of the photosensitive elements therein.

Optionally, the bonding of the first bonding layer to the second bonding layer may be accomplished by hybrid bonding.

In another aspect, the present invention provides an image sensor structure including:

a pixel substrate having opposing first and second surfaces and a plurality of photosensitive elements between the first and second surfaces, the second surface formed thereon with a metal grid;

a first interconnect structure and a first bonding layer connected to the first interconnect structure, which are successively formed on the first surface, the first bonding layer including first metal bond pads; and at least one die including a signal processing circuit and/or a storage device for the photosensitive elements, a second interconnect structure and a second bonding layer connected to the second interconnect structure, the second bonding layer including second metal bond pads, wherein the at least one die is bonded to the pixel substrate by bonding the first bonding layer to the second bonding layer.

Optionally, the image sensor structure may further include:

a filling layer on a region of the first surface not covered by the die; and metal pads formed on the side of the second surface of the pixel substrate, the metal pads connected to the first interconnect structure.

Optionally, among the at least one die bonded to the pixel substrate, at least one may be a logic circuit unit including the signal processing circuit, and at least another one may be a storage unit including the storage device, wherein the logic circuit unit and the storage unit are interconnected by the first interconnect structure.

In the method and image sensor structure provided in the present invention, the at least one die is bonded to the pixel substrate by bonding the first bonding layer to the second bonding layer, and the die includes the signal processing circuit and/or the storage device for the photosensitive elements in the pixel substrate. The die is bonded to the pixel substrate so that the signal processing circuit and/or the storage device is/are coupled to the photosensitive elements in the pixel substrate. In this way, signal processing and/or storage functions of the image sensor can be provided without additional occupation of the area of the pixel substrate. Compared with a conventional structure in which a photosensitive area and a logic circuit area are both arranged in a 2D plane, the present invention allows for more photosensitive elements to be arranged on the pixel substrate with the same area and thus can achieve a larger photosensitive area. Moreover, less wiring is needed on the 2D plane of the pixel substrate, helping in reducing interference with signals and delays and improving imaging quality.

BRIEF DESCRIPTION OF THE DRAWINGS

FIG. 1 is a flowchart of a method of fabricating an image sensor structure according to an embodiment of the present invention.

FIGS. 2 to 7 are schematic cross-sectional views of intermediate structures produced in steps in a method of fabricating an image sensor structure according to an embodiment of the present invention.

Figure 4:
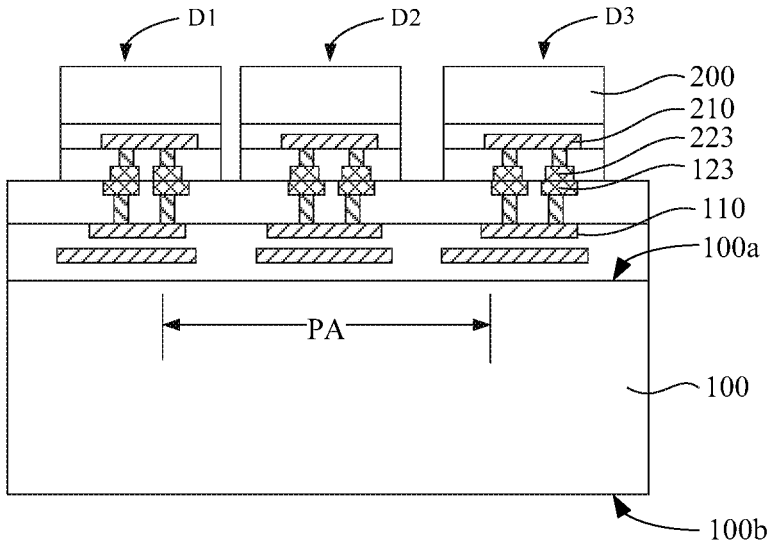

In these figures,

100—pixel substrate; 100a—first surface; 100b—second surface; 110—first interconnect structure; 120—first bonding layer; 121—first dielectric layer; 122—first bond contact; 123—first metal bond pad; 200—semiconductor substrate; 210—second interconnect structure; 220—second bonding layer; 221—second dielectric layer; 222—second bond contact; 223—second metal bond pad; 130—metal grid; 130a—opening; 140—third dielectric layer; 140a—trench; 150—metal pad; 300—filling layer; 10—carrier substrate.

DETAILED DESCRIPTION

Particular embodiments of the present invention will be described in greater detail below with reference to the accompanying drawings. From the following description, advantages and features of the invention will become more apparent. It is to be understood that the figures are provided in a very simplified form not necessarily drawn to exact scale for the only purpose of facilitating easy and clear description of the embodiments.

Referring to FIG. 1, a method of fabricating an image sensor structure according to an embodiment of the present invention includes the steps of:

S1) providing a pixel substrate having opposing first and second surfaces and a plurality of photosensitive elements between the first and second surfaces and successively forming, on the first surface, a first interconnect structure and a first bonding layer connected to the first interconnect structure, the first bonding layer including first metal bond pads;

S2) forming at least one die including a signal processing circuit and/or a storage device for the photosensitive elements, a second interconnect structure and a second bonding layer connected to the second interconnect structure, the second bonding layer including second metal bond pads;

S3) bonding the at least one die to the pixel substrate by bonding the first bonding layer to the second bonding layer, wherein the first metal bond pads are electrically connected to the second metal bond pads; and S4) forming a metal grid on the second surface.

The method will be further described below with reference to FIGS. 2 to 7.

Referring to FIG. 2, the pixel substrate 100 provided in step S1 may include a semiconductor substrate in which the photosensitive elements (not shown) have been formed. The semiconductor substrate may be a silicon substrate, a germanium (Ge) substrate, a silicon germanium substrate, a silicon on insulator (SOI) substrate, a germanium on insulator (GOI) substrate or the like. Here, the semiconductor substrate may be a silicon substrate, for example. The silicon substrate may have opposing front and back surfaces. The plurality of photosensitive elements may be formed in the silicon substrate, for example, by implanting ions through the front surface of the silicon substrate. The photosensitive element may include photodiodes. Each photosensitive element belongs to one pixel. The photosensitive elements are arranged in an area of the pixel substrate, called a photosensitive area denoted by PA. In this embodiment, the extent of the photosensitive area PA of the pixel substrate 100 may substantially correspond to that of the subsequently formed metal grid. In some embodiments, the photosensitive area PA may not have a distinct boundary. In this embodiment, the front surface of the silicon substrate 100 is the aforementioned first surface 100a, and the back surface of the silicon substrate 100 is the aforementioned second surface 100b.

The first interconnect structure 110 is formed on the first surface 100a of the pixel substrate 100 (i.e., on the side of the pixel substrate 100 away from the second surface 100b). The first interconnect structure 110 may include patterned metal layers (e.g., redistribution layers (RDLs)) isolated by a dielectric material and conductive plugs connecting adjacent metal layers. The metal layers and conductive plugs can provide connections between various doped regions, circuits and input/output ports on the pixel substrate 100. Specifically, the first interconnect structure 110 may connect different photosensitive elements. Optionally, transistors corresponding to the respective photosensitive elements may be formed on the first surface 100a, such as pass transistors, reset transistors, source followers, etc. In this case, the first interconnect structure 110 may also connect these transistors. For brevity, only some metal layers in the first interconnect structure 110 are shown in FIG. 2.

The first bonding layer 120 is formed on the first interconnect structure 110 so as to be connected to the first interconnect structure 110. As shown in FIG. 2, the first bonding layer 120 may include a first dielectric layer 121, first bond contacts 122 and first metal bond pads 123, both the first bond contacts 122 and the first metal bond pads 123 are formed in the first dielectric layer 121. The first bond contacts 122 contact and connect the metal layers in the first interconnect structure 110 at one end and the first metal bond pads 123 on the other end. Top surfaces of the first metal bond pads 123 are exposed from the first dielectric layer 121. Optionally, orthographic projections of at least some of the first metal bond pads 123 in the first bonding layer 120 on the first surface 100a may be encompassed by an orthographic projection of the photosensitive area PA on the first surface 100a. The present invention is not limited to any particular number or size of the first metal bond pads 123.

Referring to FIG. 3, in step S2, the at least one die is formed. For example, dies D1, D2 and D3 as shown in FIG. 3 may be formed. Each die includes a signal processing circuit and/or a storage device (not shown) for the photosensitive elements in the pixel substrate 100. The signal processing circuit for the photosensitive elements may include image signal processing circuits such as, but not limited to, analog-to-digital conversion, correlated double sampling and decoding. The signal processing circuit for the photosensitive elements may include various devices and circuits required by functions of the image sensor in addition to those for the photosensitive elements. For example, in one embodiment, the signal processing circuit for the photosensitive elements may include a readout circuit consisting of pass transistors, reset transistors, source followers, etc. The storage device may include a dynamic random access memory (DRAM), static random access memory (SRAM) or other memory device. The storage device may be used to store signals read from the photosensitive elements, analog image signals, images obtained by processing the image signals, or a combination thereof. The signal processing circuit and/or the storage device for the photosensitive elements may be formed in a single die, or distributed between different dies. For example, as shown in FIG. 3, the at least one die (e.g., D1 and D2) may include the signal processing circuit for the photosensitive elements but not the storage device. In this case, the die is referred to as a logic circuit unit. Alternatively, the at least one die (e.g., D3) may include the storage device but not the signal processing circuit for the photosensitive elements. In this case, the die is referred to as a storage unit. In the case of multiple dies each including a signal processing circuit for the photosensitive element, these signal processing circuits may be either identical or not.

For each die, the signal processing circuit and/or storage device may be formed on a semiconductor substrate 200 by conventional semiconductor processes, and the die may be then obtained by dicing the substrate. Moreover, after the formation of the signal processing circuit and/or storage device and prior to the dicing process, for each die, the second interconnect structure 210 and the second bonding layer 220 may be formed on the semiconductor substrate 200. In order to reduce a thickness of the image sensor structure being fabricated, the semiconductor substrate 200 may be thinned from its back side after the formation of the signal processing circuit and/or storage device. In each die, the second interconnect structure 210 may be connected to the signal processing circuit and/or the storage device fabricated on the semiconductor substrate 200 and include patterned metal layers (e.g., redistribution layers (RDLs)) isolated by a dielectric material and conductive plugs connecting adjacent metal layers. For brevity, FIG. 3 shows only a metal layer in the second interconnect structure 210, which is most distal from the semiconductor substrate 200.

In each die, the second bonding layer 220 is formed on the second interconnect structure 210 so as to be connected to the second interconnect structure 210. As shown in FIG. 3, the second bonding layer may include a second dielectric layer 221, second bond contacts 222 and second metal bond pads 223, both second bond contacts 222 and second metal bond pads 223 are formed in the second dielectric layer 221. The second bond contacts 222 contact and connect the metal layers in the second interconnect structure 210 at one end and the second metal bond pads 223 on the other end. Top surfaces of the second metal bond pads 223 are exposed from the second dielectric layer 221.

Referring to FIG. 4, in step S3, the at least one die is bonded to the pixel substrate 100 by bonding the first bonding layer 120 to the second bonding layer 220, for example, using a chip-to-wafer (C2W) process. Specifically, the bonding may be accomplished, for example, by hybrid bonding or microbump bonding, with hybrid bonding being preferred because this technique allows a reduced pitch between connection points. As required by the circuit design, each second metal bond pad 223 in each die to be bonded to the pixel substrate 100 corresponds to a respective one of the first metal bond pads 123 on the pixel substrate 100. In the case of hybrid bonding, at least part of each second metal bond pad 223 in each die may be bonded to at least part of the respective first metal bond pad 123 on the pixel substrate 100 so that an electrical connection is established between the first metal bond pad and the second metal bond pad. In addition, the second dielectric layer 221 in each die may be bonded to the first dielectric layer 121 on the pixel substrate 100. Further, any second metal bond pad 223 or any portion thereof in facing opposition to the first dielectric layer 121 may also be bonded to the first dielectric layer 121. Likewise, any first metal bond pad 123 or any portion thereof in facing opposition to the second dielectric layer 221 may also be bonded to the second dielectric layer 221. As a result of step S3, each die vertically stacked on the pixel substrate 100 is electrically connected to the pixel substrate to perform some functions of the image sensor. This helps reducing the area of the pixel substrate 100 and improving imaging quality. As an example, among the die(s) bonded to the pixel substrate 100 by bonding the first bonding layer 120 to the second bonding layer 220, at least one is logic circuit unit(s) each including the aforementioned signal processing circuit for the photosensitive elements (e.g., D1 and D2), and at least another one is storage unit(s) each including the aforementioned storage device (e.g., D3). Optionally, the logic circuit unit(s) and the storage unit(s) bonded to the pixel substrate 100 may be interconnected by the first interconnect structure 110 on the pixel substrate 100.

The image sensor structure fabricated using the method according to this embodiment is, for example, a backside illuminated (BSI) structure configured so that light is incident on the side of the second surface 100b of the pixel substrate 100. The die(s) may be bonded to the pixel substrate 100 so that at least some thereof are at least partially located above the photosensitive area PA. That is, orthographic projections of at least some of the die(s) on the first surface 100a at least partially overlap the orthographic projection of the photosensitive area PA on the first surface 100a. As shown in FIG. 4, as an example, the orthographic projection of the die D2 on the first surface 100a is entirely encompassed by the orthographic projection of the photosensitive area PA on the first surface 100a. Since the die(s) is/are provided on the side of the first surface 100a, operation of the photosensitive area PA is not affected thereby.

Figure 5:
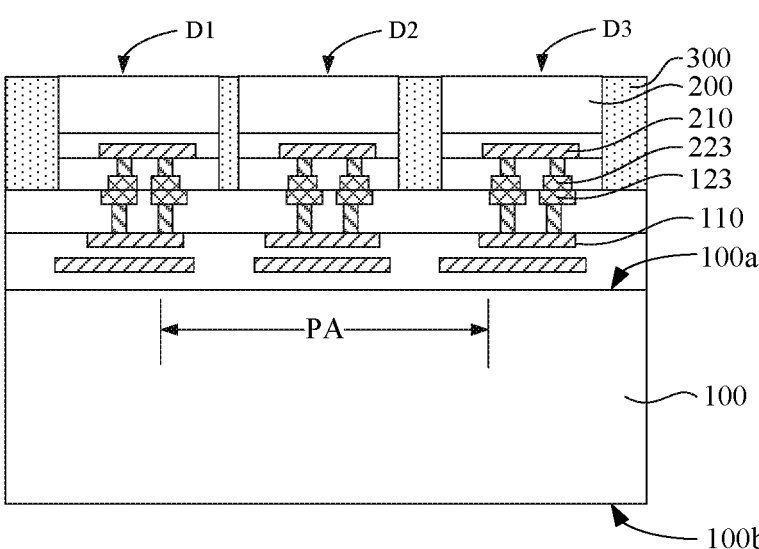

Referring to FIG. 5, after the at least one die is bonded to the pixel substrate 100, before any further semiconductor process is carried out on the second surface 100b of the pixel substrate 100, a filling layer 300 may be formed on a region of the first bonding layer 120 not covered by the die. This may in particular include: depositing a dielectric material on the first surface 100a of the pixel substrate 100, which may include one of silicon nitride, silica, silicon oxynitride and other inorganic materials, or an organic material, so that the dielectric material covers the region of the first bonding layer 120 not covered by the die and has a top surface which is higher than a top surface of the die, for example; and then performing a planarization process, as a result of which the top surface of the die (i.e., the surface away from the pixel substrate 100) is exposed. Exposing the top surface of the die can facilitates dissipation of heat therefrom.

Figures 6, 7:
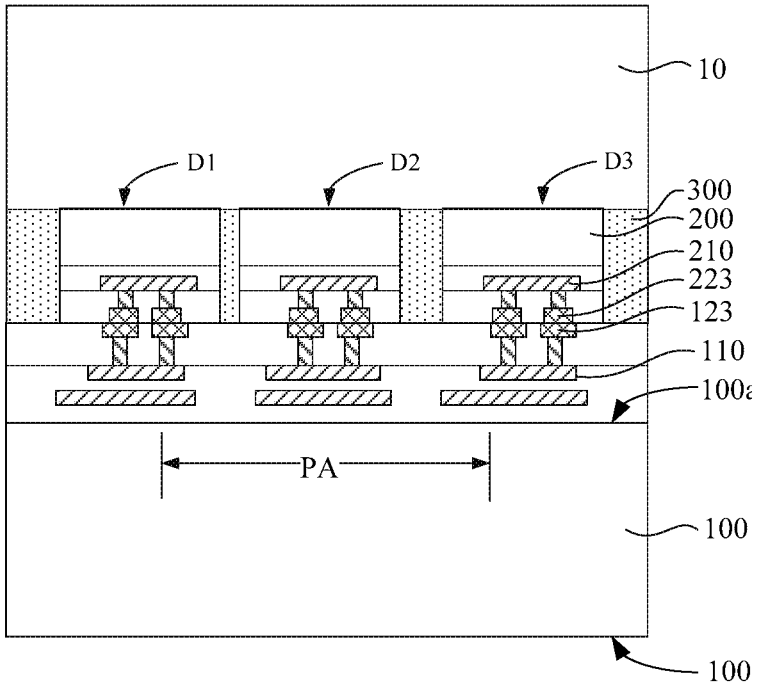

Referring to FIG. 6, in order to facilitate processes to be performed on the side of the second surface 100b of the pixel substrate 100, a carrier substrate 10 may be bonded to the die and the filling layer 300. The carrier substrate 10 may be a silicon substrate or another substrate suitable for providing support. After the bonding of the carrier substrate 10, the whole structure may be flipped upside down so that the second surface 100b of the pixel substrate 100 faces upward.

Referring to FIG. 7, in step S4, the metal grid 130 is formed on the second surface 100b. Specifically, the pixel substrate 100 may be thinned from the side of the second surface 100b, and the metal grid 130 may be formed on the second surface 100b that has undergone the thinning process. The metal grid 130 can isolate incident light between the photosensitive elements in the pixel substrate 100 and thereby defining the ranges of respective pixels in the photosensitive area. As an example, the formation of the metal grid may include: successively stacking a bottom dielectric layer, a metal layer and a mask layer over the second surface 100b of the pixel substrate 100; and patterning the stacked bottom dielectric layer, the metal layer and the mask layer to form openings 130a in alignment with the respective photosensitive elements, in which the second surface 100b of the pixel substrate 100 is exposed, and the metal grid 130 surrounding the openings 130a.

Optionally, metal pads 150 connected to the first interconnect structure 110 may be formed on the second surface 100b of the pixel substrate 100. The metal pads 150 may be connected to external electronic signals for, among others, supplying power to and controlling the components in the pixel substrate 100 and the die. As an example, after the formation of the metal grid 130, a third dielectric layer 140 may be deposited on the second surface 100b of the pixel substrate 100, and trenches 140a may be formed in the third dielectric layer 140 external to the metal grid 130. After that, holes which extend through the pixel substrate 100 and in which metal layers in the first interconnect structure 110 are exposed may be formed in bottom surfaces of the trenches 140a by photolithography and etching processes. Subsequently, a barrier material may be deposited on surfaces of the trenches 140a and the holes, and an anisotropic etching process may be performed to remove part of the barrier material so that the metal layers in the first interconnect structure 110 are again exposed at the bottom of the holes. Afterward, a metal (e.g., aluminum) may be deposited in the holes and the trenches 140a and then subjected to photolithography and etching processes. In this way, the metal pads 150 can be formed in the trenches 140a.

The carrier substrate 10 may be removed after all the intended processed on the second surface 100b have been finished, resulting in the formation of the image sensor structure.

An embodiment of the present invention relates to an image sensor structure, which, as shown in FIGS. 2 to 7, includes a pixel substrate 100 having opposing first surface 100a and second surface 100b and a plurality of photosensitive elements between the first surface 100a and second surface 100b. A metal grid 130 is formed on the second surface 100b. The image sensor structure further includes, successively formed on the first surface 100a, a first interconnect structure 110 and a first bonding layer 120 connected to the first interconnect structure 110. The first bonding layer 120 includes first metal bond pads 123. The image sensor structure further includes at least one die (e.g., D1, D2, D3) each including a signal processing circuit and/or a storage device for the photosensitive elements, a second interconnect structure 210 and a second bonding layer 220 connected to the second interconnect structure 210. The second bonding layer 220 includes second metal bond pads 223. The at least one die is bonded to the pixel substrate 100 by bonding the first bonding layer 120 to the second bonding layer 220.

In some embodiments, a plurality of the dies are bonded to the pixel substrate 100. At least one of the dies is a logic circuit unit including the signal processing circuit for the photosensitive elements, and at least another one of the dies is a storage unit including the storage device. Moreover, the logic circuit unit and the storage unit are interconnected by the first interconnect structure 110.

In some embodiments, the image sensor structure may further include a filling layer 300 covering a region of the pixel substrate 100 (i.e., of the first bonding layer 120) not covered by the die. The image sensor structure may further include metal pads 150 formed on the side of the second surface 100b of the pixel substrate 100. The metal pads 150 may be connected to the first interconnect structure 110 in the pixel substrate 100.

In some embodiments, among the die(s) bonded to the pixel substrate 100 by bonding the first bonding layer 120 to the second bonding layer 220, at least one is a logic circuit unit including the signal processing circuit, and at least another one is a storage unit including the storage device. The logic circuit unit and the storage unit are interconnected by the first interconnect structure 110.

In the method and image sensor structure provided in the embodiments of the present invention, the at least one die is bonded to the pixel substrate 100 by bonding the first bonding layer 120 to the second bonding layer 220, and the die includes the signal processing circuit and/or the storage device for the photosensitive elements in the pixel substrate 100. The die is bonded to the pixel substrate 100 so that the signal processing circuit and/or the storage device is/are coupled to the photosensitive elements in the pixel substrate 100. In this way, signal processing and/or storage functions of the image sensor can be provided without additional occupation of the area of the pixel substrate 100. Compared with a conventional structure in which a photosensitive area and a logic circuit area are both arranged in a 2D plane, the embodiments of the present invention allow for more photosensitive elements to be arranged on the pixel substrate 100 with the same area and thus can achieve a larger photosensitive area. Moreover, less wiring is needed on the 2D plane of the pixel substrate 100, helping in reducing interference with signals and delays and improving imaging quality.

It is to be noted that the embodiments disclosed herein are described in a progressive manner, with the description of each embodiment focusing on its differences from others. Reference can be made between the embodiments for their identical or similar parts.

The foregoing description is merely that of several preferred embodiments of the present invention and is not intended to limit the scope of the claims of the invention in any way. Any person of skill in the art may make various possible variations and changes to the disclosed embodiments in light of the methodologies and teachings disclosed hereinabove, without departing from the spirit and scope of the invention. Accordingly, any and all such simple variations, equivalent alternatives and modifications made to the foregoing embodiments based on the essence of the present invention without departing from the scope of the embodiments are intended to fall within the scope of protection of the invention.

What is claimed is:

1. A method of fabricating an image sensor structure, comprising:

providing a pixel substrate having opposing first and second surfaces and a plurality of photosensitive elements between the first and second surfaces and successively forming, on the first surface, a first interconnect structure and a first bonding layer connected to the first interconnect structure, the first bonding layer comprising first metal bond pads;

forming at least one die comprising a signal processing circuit and/or a storage device for the photosensitive elements, a second interconnect structure and a second bonding layer connected to the second interconnect structure, the second bonding layer comprising second metal bond pads;

bonding the at least one die to the pixel substrate by bonding the first bonding layer to the second bonding layer, wherein the first metal bond pads are electrically connected to the second metal bond pads, the bonding of the first bonding layer to the second bonding layer is accomplished by hybrid bonding;

forming a filling layer on a region of the first bonding layer not covered by the die, wherein the formation of the filling layer comprises: depositing a dielectric material over the pixel substrate on the region of the first bonding layer not covered by the die so that a top surface of the dielectric material is higher than a top surface of the die; and performing a planarization process on the top surface of the dielectric material so that the top surface of the die is exposed;

after bonding the at least one die to the pixel substrate, forming metal pads on the second surface of the pixel substrate, the metal pads being connected to the first interconnect structure through through-silicon vias penetrating the pixel substrate; and after forming the metal pads, forming a metal grid on the second surface.

2. The method according to claim 1, wherein before the metal grid is formed, the pixel substrate is thinned from the second surface, and wherein before the pixel substrate is thinned, the filling layer is formed on the region of the first bonding layer not covered by the die, and a carrier substrate is bonded to the die and the filling layer.

3. The method according to claim 1, wherein the die comprises a semiconductor substrate that has undergone a dicing process, and wherein before the semiconductor substrate is subjected to the dicing process, the semiconductor substrate is thinned from a side away from the second bonding layer.

4. The method according to claim 1, wherein after the at least one die is bonded to the pixel substrate, an orthographic projection of at least some of the die on the first surface at least partially overlap an orthographic projection of a photosensitive area on the first surface, the photosensitive area adapted for arrangement of the photosensitive elements therein.

5. The method according to claim 4, wherein the orthographic projection of the die on the first surface is entirely encompassed by the orthographic projection of the photosensitive area on the first surface.

6. The method according to claim 1, wherein the formation of the metal grid comprises:

successively stacking a bottom dielectric layer, a metal layer and a mask layer over the second surface of the pixel substrate; and patterning the stacked bottom dielectric layer, the metal layer and the mask layer to form openings in alignment with the respective photosensitive elements, in which the second surface of the pixel substrate is exposed, and the metal grid surrounding the openings.

7. The method according to claim 1, wherein among the at least one die bonded to the pixel substrate, at least one of the dies is a logic circuit unit comprising the signal processing circuit, and at least another one of the dies is a storage unit comprising the storage device, and wherein the logic circuit unit and the storage unit are interconnected by the first interconnect structure.

* * * * *